(12) United States Patent
Saiki et al.

(10) Patent No.: US 7,692,103 B2
(45) Date of Patent: Apr. 6, 2010

(54) WIRING SUBSTRATE AND MANUFACTURING PROCESS OF THE SAME

(75) Inventors: Hajime Saiki, Aichi (JP); Mikiya Sakurai, Kani (JP)

(73) Assignee: NGK Spark Plug Co., Ltd., Aichi (JP)

( * ) Notice: Subject to any disclaimer, the term of this patent is extended or adjusted under 35 U.S.C. 154(b) by 1196 days.

(21) Appl. No.: 10/989,517

(22) Filed: Nov. 17, 2004

(65) Prior Publication Data
US 2005/0103520 A1    May 19, 2005

(30) Foreign Application Priority Data
Nov. 18, 2003   (JP)   ............ P.2003-388493

(51) Int. Cl.
H01R 12/04   (2006.01)
H05K 1/11    (2006.01)
H05K 3/02    (2006.01)

(52) U.S. Cl. ........................ 174/262; 29/847
(58) Field of Classification Search ......... 174/262–266; 361/792–795; 29/846–853
See application file for complete search history.

(56) References Cited

U.S. PATENT DOCUMENTS

2002/0161100 A1 *  10/2002  Kojima et al. ............... 524/492
2008/0190658 A1 *  8/2008   Toyoda et al. ............... 174/263

FOREIGN PATENT DOCUMENTS

| JP | 2000-349437  | 12/2000 |
|----|--------------|---------|
| JP | 2001237552   | 8/2001  |
| JP | 2001-1257474 | 9/2001  |
| JP | 2001342450   | 12/2001 |
| JP | 2001352007   | 12/2001 |
| JP | 2003-168866  | 6/2003  |
| JP | 2003-179352  | 6/2003  |
| JP | 2003-188539  | 7/2003  |
| JP | 2003198148   | 7/2003  |
| JP | 2003-258430  | 9/2003  |
| JP | 2003258436   | 9/2003  |
| JP | 2003289183   | 10/2003 |

* cited by examiner

*Primary Examiner*—Jeremy C Norris
(74) *Attorney, Agent, or Firm*—Stites & Harbison PLLC; Ross F. Hunt, Jr.; Jeffrey A. Haeberlin

(57) ABSTRACT

A wiring substrate includes a lower insulating resin layer; wiring pattern layers provided on surfaces of the lower insulating resin layer; upper insulating resin layers; and via holes and via conductors connected electrically with at least one of the wiring pattern layers. An upper insulating resin layer includes an epoxy resin containing 30 to 50% by weight of an inorganic filler of $SiO_2$ having an average grain diameter of 1.0 to 10.0 μm, and a via having a lower end opening diameter of between 40 μm and 60 μm.

9 Claims, 5 Drawing Sheets

WIRING SUBSTRATE AND MANUFACTURING PROCESS OF THE SAME

FIELD OF THE INVENTION

The present invention relates to a wiring substrate having diametrically small via holes and via conductors, and to a process for manufacturing the same.

BACKGROUND OF THE INVENTION

According to the trend of recent years for a high performance and a high signal-processing rate, there has been enhanced a demand for making the size of the wiring substrate smaller, the pitch of the wiring pattern layers finer and the radius of the via conductors smaller.

For example, an insulating resin layer between one wiring pattern layer and two adjacent wiring pattern layers is generally restricted by a practical limit of the section of a length×a width of 25 µm×25 µm. However, it has been demanded that the length and the width are individually 20 µm or less.

In order to satisfy these demands, it is necessary not only to reduce the diameters of the via conductors for connecting the wiring pattern layers on the upper side and on the lower side and the via holes for fitting the via conductors.

In case the lower lands have a diameter of 132 µm and the upper lands have a diameter of 138 µm, for example, the via holes and the via conductors formed inbetween in the prior art has a lower end diameter of about 60 µm and an upper end diameter of 68 µm (as referred to JP-A-2003-258430 (page 4, FIGS. 1 and 2), for example).

In case the wiring pattern layers are formed into a finer pitch such as the lower layer land having a diameter of 103 µm and the higher layer land having a diameter of 110 µm, it is necessary to confine the diameter of the lower end of the via holes and the via conductors to be formed between those lands within a range of about 40 to 60 µm and the diameter of the upper end of the same to about 65 µm or less.

However, it has been impossible for the insulating resin layer of the prior art containing about 18 wt. % (% by weight) of the inorganic filler under the laser irradiating conditions (e.g., the output: 0.4 mJ, the aperture diameter of the slit opening of a laser machining apparatus: 0.5 µm, the shot number: 2) to form the via holes having the aforementioned small diameter in the insulating resin layers.

SUMMARY OF THE INVENTION

The invention contemplates to solve the aforementioned problems in the background art, and has an object to provide a wiring substrate having diametrically small via holes and via conductors, and a process for manufacturing the wiring substrate reliably.

In order to achieve the aforementioned object, the invention has been conceived by noting the selection of an insulating resin layer to form a via hole therein and the optimization of laser conditions.

Specifically, according to the invention, there is provided a wiring substrate comprising: a lower insulating resin layer; wiring pattern layers formed on the surfaces of the lower insulating resin layer; upper insulating resin layers formed on the surfaces of the lower insulating resin layer and the wiring pattern layers; via holes extending through at least one of the upper insulating resin layers; and via conductors formed in the via holes and connected electrically with at least one of the wiring pattern layers, wherein at least one of the upper insulating resin layers (preferably, each of the upper insulating resin layers) contains an epoxy resin containing 30 wt. % or more and 50 wt. % or less of an inorganic filler composed of $SiO_2$ having an average grain diameter of 1.0 µm or more to 10.0 µm or less, and wherein at least one of the via holes (preferably, each of the via holes) has a lower end opening diameter of 40 µm or more and less than 60 µm on the sides of the wiring pattern layers. Preferably, an amount of the epoxy resin contained in at least one of the upper insulating resin layers (preferably, in each of the upper insulating resin layers) is 50 to 70% by weight, based on a weight of each of the upper insulating resin layers.

According to this wiring substrate, the diametrically small via holes are highly precisely formed in the upper insulating resin layers containing a large quantity of inorganic filler. Even if the lower wiring pattern and the upper wiring pattern are arranged at the fine pitch, the via conductors for conducting those patterns can be diametrically reduced and precisely arranged. Therefore, the wiring pattern layers can be finely pitched to reduce the wiring substrate diametrically.

Here, the wiring pattern layers are formed on the surface of the lower insulating resin layer, and the upper insulating resin layers, through which the via holes are to be extended, are formed on the surfaces of the wiring pattern layers and the lower insulating resin layer. The lower insulating resin layer includes the insulating resin layer in the core substrate or the built-up layer. On the other hand, the upper insulating resin layers are formed on the surfaces of the wiring pattern layers and the lower insulating resin layer, and have the via holes extended therethrough. The upper insulating resin layers and the lower insulating resin layer are named to relate to each other.

Moreover, the lower end opening diameter of the via holes is 40 µm or more. This is because the electric conduction and the adhesion between the via conductors to be formed in the via holes and the lower wiring pattern layer may become insufficient, if the lower end opening diameter is 40 µm or less. At the same time, the opening diameter is set less than 60 µm, because the larger opening diameter is hard to give the wiring pattern layers a finer pitch.

According to the invention, there can also be provided, as a preferable embodiment, a wiring substrate, wherein the upper end opening diameter of the via holes on the opposite side of the wiring pattern layer is 60 µm or more and 65 µm or less. According to this wiring substrate, it is possible to keep the electric conduction and the adhesion sufficiently between the via conductors to be formed in the via holes and the upper wiring pattern layers, and to match the fine pitch of the wiring pattern layers easily.

There can be further provided, as a preferable embodiment, a wiring substrate, wherein the wiring pattern layers are via lands formed into a generally circular shape in a top plan view and having a diameter of 60 µm or more and 110 µm or less. According to this wiring substrate, it is possible to ensure the connection between the via conductors to be formed in the via holes and the via land, and to keep a distance necessary for the electric insulation between the adjoining wiring pattern layers.

The diameter of the via land exceeding 110 µm is excepted, because a larger diameter makes it difficult to give the wiring pattern layers a fine pitch.

According to the invention, on the other hand, there is provided, as a preferable embodiment, a process for manufacturing a wiring substrate, comprising: the step of forming wiring pattern layers on the surfaces of a lower insulating resin layer; the step of forming upper insulating resin layers on the surfaces of the lower insulating resin layer and the wiring pattern layers; and the step of forming via holes in the upper insulating resin layers by a laser machining, wherein at least one of the upper insulating resin layers (preferably, each of the upper insulating resin layers) contains an epoxy resin containing 30 wt. % or more and 50 wt. % or less of an inorganic filler composed of $SiO_2$ having an average grain diameter of 1.0 μm or more to 10.0 μm or less, wherein at least one of the via holes (preferably, each of the via holes) has a lower end opening diameter of 40 μm or more and less than 60 μm on the sides of the wiring pattern layers, and wherein the via holes are opened by a plurality of shots of the laser machining. Preferably, an amount of the epoxy resin contained in at least one of the upper insulating resin layers (preferably, in each of the upper insulating resin layers) is 50 to 70% by weight, based on a weight of each of the upper insulating resin layers.

According to this process, the diametrically small via holes can be precisely formed in the upper insulating resin layers containing a large quantity of inorganic filler. The via conductors for conducting the lower wiring pattern layer and the upper wiring pattern layers can be diametrically reduced and precisely arranged, even if the lower and upper wiring pattern layers are wired at the fine pitch. Therefore, it is possible to form the wiring pattern layers at the fine pitch and to manufacture the small-sized wiring substrate reliably.

According to a preferable embodiment of the invention, a wiring substrate manufacturing process further comprises the step of roughening, after the step of forming the via holes, the inner wall faces of the via holes, wherein the roughened inner wall faces have a roughness of Ra of 0.2 μm or more and 1.0 μm or less. According to this process, the diametrically reduced via conductors formed after the diametrically small via holes can be firmly adhered to the upper insulating resin layers.

Here, it is preferred that the roughened inner wall faces of the via holes have a surface roughness of Ra: 0.2 μm or more and 1.0 μm or less and Rz: 0.2 μm or more and 1.0 μm or less. Here, the roughness Ra indicates a center line average roughness, and the roughness Rz indicates a ten-point average roughness.

There can be further provided, as a preferable embodiment, a wiring substrate manufacturing process, wherein the laser machining opens the via holes by three or more shots.

According to this process, the via holes having the lower end opening diameter can be reliably formed in the upper insulating resin layers containing a large quantity of inorganic filler.

There can be further provided, as a preferable embodiment, a wiring substrate manufacturing process, wherein the conditions of the laser to irradiate the upper insulating resin layers are the output: about 0.4 mJ, and the aperture diameter of the slit opening of the laser machining apparatus: about 0.55 mm or more and 0.64 mm or less.

According to this process, too, the via holes having the lower end opening diameter can be reliably formed in the upper insulating resin layers.

DETAILED DESCRIPTION OF THE INVENTION

The best mode for carrying out the invention will be described in the following.

Figure 1:
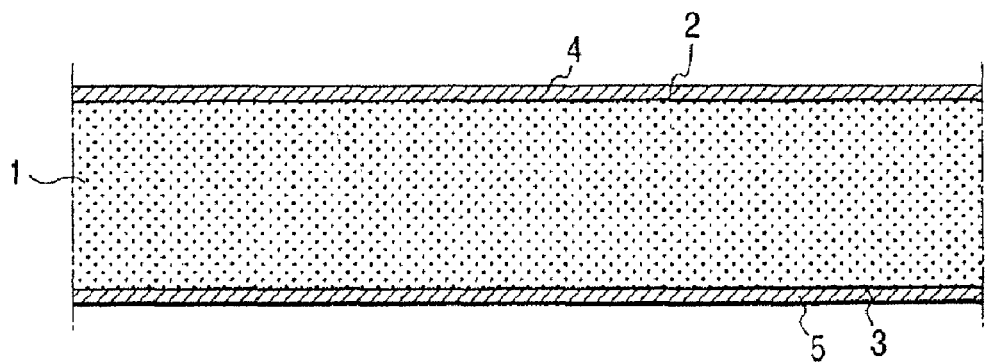
FIG. 1 is a schematic section showing one step of a process for manufacturing a wiring substrate according to the invention.

FIG. 1 is a section showing a core substrate 1 (or a lower insulating resin layer) made of a bismaleimide triazine (BT) resin having a thickness of about 0.7 mm. This core substrate 1 is covered on its surface 2 and a back 3, respectively, with copper foils 4 and 5 having a thickness of about 70 μm. The not-shown photosensitive/insulating dry film is formed over those copper foils 4 and 5 and is subjected to an exposure and a development of a predetermined pattern. After this, the etching resist obtained is removed with a peeling liquid (according to the well-known subtractive method).

Here, a multi-panel having a plurality of core substrates 1 may be used so that the individual core substrates 1 may be subjected to a similar treatment step (as in the following individual steps).

Figure 2:
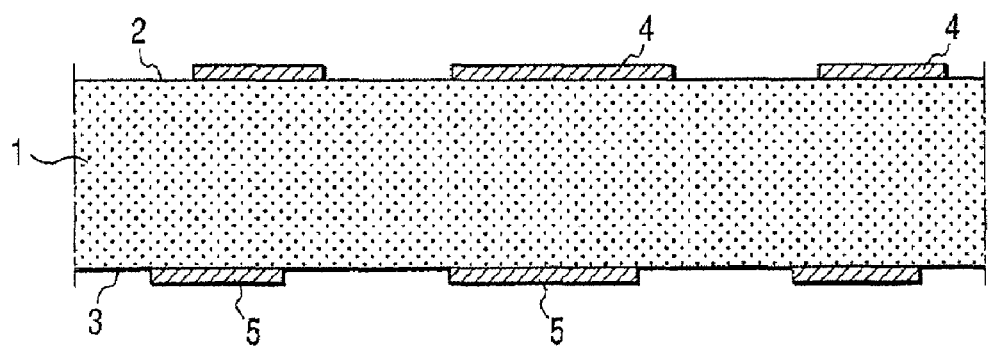
FIG. 2 is a schematic section showing a manufacturing process subsequent to FIG. 1.

As a result, the copper foils 4 and 5 become wiring pattern layers 4 and 5 profiling the aforementioned pattern, as shown in FIG. 2.

Figure 3:
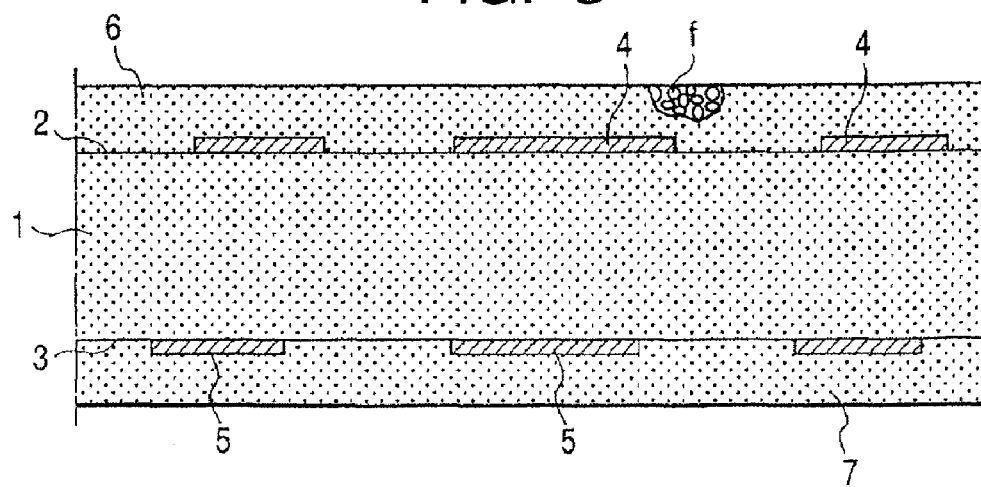
FIG. 3 is a schematic section showing a manufacturing process subsequent to FIG. 2.

Next, the surface 2 of the core substrate 1 and the surface of the wiring pattern layer 4, and the back 3 and the surface of the wiring pattern layer 5 are individually covered thereover with an insulating film containing an epoxy resin containing an inorganic filler f, as shown in FIG. 3, to form upper insulating resin layers 6 and 7. (In this embodiment, the insulating film contains 64 wt. % of the epoxy resin.) These upper insulating resin layers 6 and 7 have a thickness of about 40 μm, and contain 30 to 50 wt. % (e.g., 36 wt. % in this embodiment) of an inorganic filler f made of generally spherical $SiO_2$. The upper insulating resin layers 6 and 7 also have properties of an elongation: 6% or less (e.g., 5.0% in this embodiment), a Young's modulus: 3.6 to 5 GPa (e.g., 4.0 GPa in this embodiment), and a thermal expansion coefficient in a planar (X-Y) direction: about 50 ppm/° C. or less (e.g., 46 ppm/° C.). Here, the inorganic filler f has an average grain diameter within a range from 1.0 μm or more to 10.0 μm or less.

Figure 5:
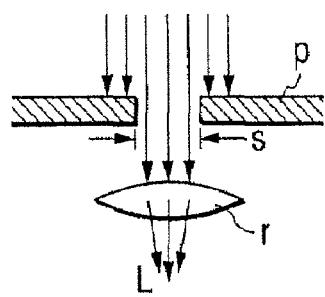
FIG. 5 is a schematic diagram showing a laser device to be used in the invention.

FIG. 5 schematically shows a laser machining device to be used in the invention. A carbon-dioxide gas laser beam L emitted with an output: 0.4 mg from the not-shown light source is shot (to irradiate) through a slit opening having a diameter (or an aperture) s: 0.55 to 0.64 μm at the position focused by a condensing lens r. The number of shots is three or more.

Figure 4:
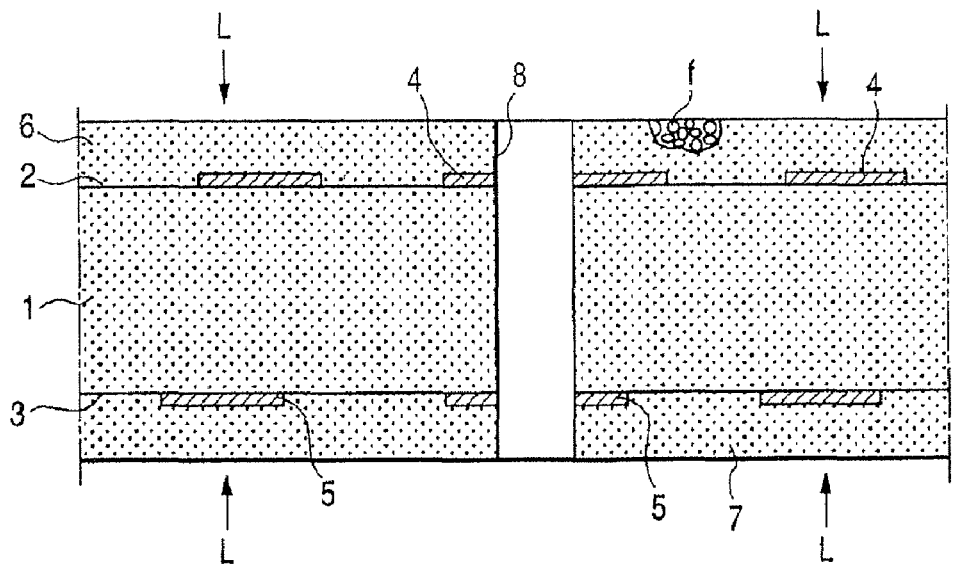
FIG. 4 is a schematic section showing a manufacturing process subsequent to FIG. 3.

By performing the laser machining, as will be described hereinafter, there are formed generally conical via holes 10 and 12, which extend through predetermined positions of the upper insulating resin layers 6 and 7 so that the wiring pattern layers 4 and 5 are exposed to the bottom faces of the via holes 10 and 12, as shown in FIG. 4.

Figure 6:
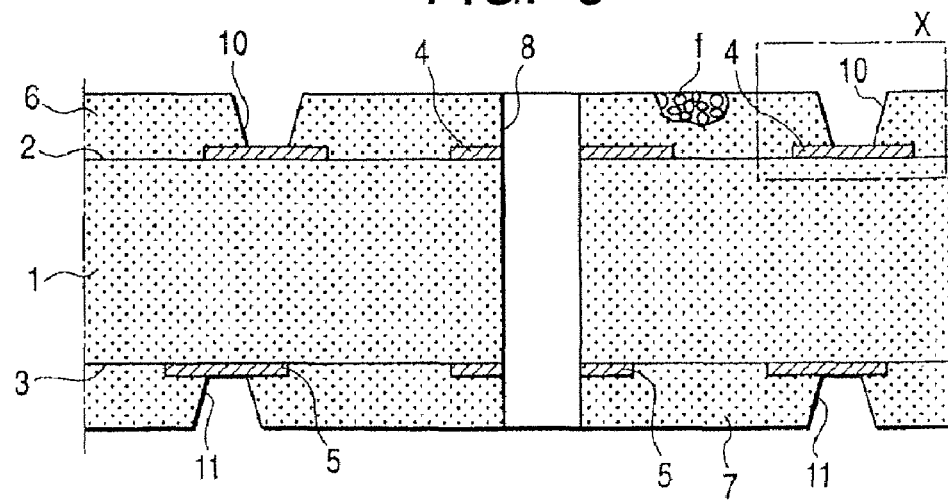
FIG. 6 is a schematic section showing a manufacturing process subsequent to FIG. 4.
Figure 7:
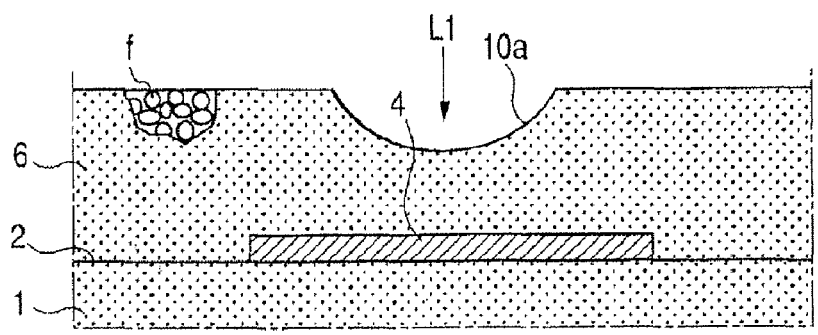
FIG. 7 is an enlarged view of a portion X indicated by single-dotted lines in FIG. 6 and a schematic section showing a manufacturing process subsequent to FIG. 4.
Figure 8:
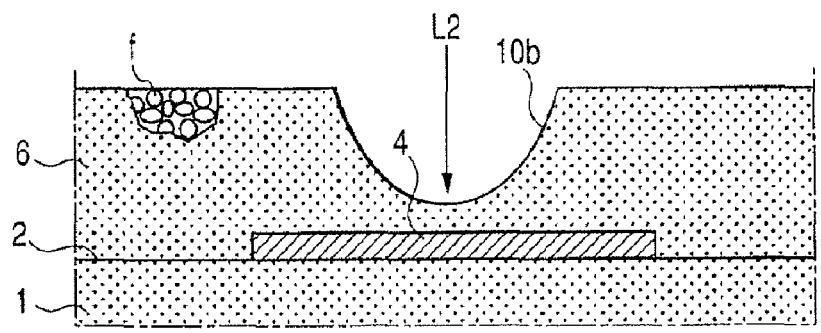
FIG. 8 is a schematic section showing a manufacturing process subsequent to FIG. 7.
Figure 9:
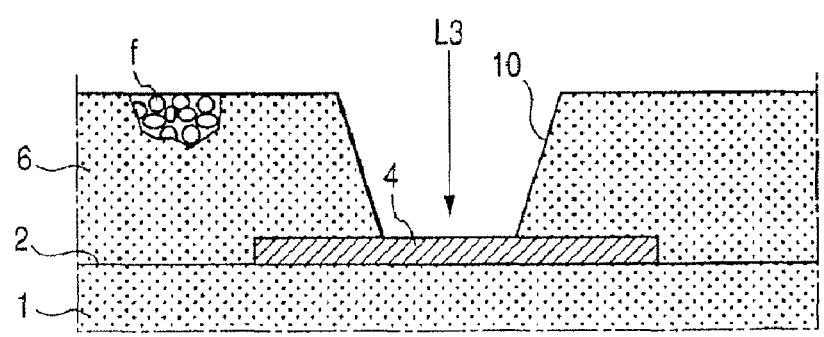
FIG. 9 is a schematic section showing a manufacturing process subsequent to FIG. 8.

The laser machining process for forming the via hole 10 at a portion, as indicated by a single-dotted portion X in FIG. 6, will be specifically described with reference to FIGS. 7 to 9.

The upper insulating resin layer 6 is once shot at its predetermined position with a carbon-dioxide gas laser L1 having the aforementioned output. As a result, a curved shallow recess 10*a* is formed in the surface of the upper insulating resin layer 6, as shown in FIG. 7. The recess 10*a* is shallow because the inorganic filler f is contained in a large quantity in the upper insulating resin layer 6.

Moreover, a second shot is made by a carbon-dioxide gas laser L2 at the upper insulating resin layer 6 near the center of the recess 10*a*. As a result, a recess 10*b* deeply curved to have a generally semicircular section is formed in the surface of the upper insulating resin layer 6, as shown in FIG. 8.

Subsequently, a third shot is made by a carbon-dioxide gas laser L3 at the upper insulating resin layer 6 near the center of the recess 10*b*. As a result, the generally conical via hole 10 is formed through the upper insulating resin layer 6, as shown in FIG. 9. The via hole 10 thus formed can be formed to have a relatively small diameter such as an aperture diameter of 40 µm to 60 µm at its lower end and an aperture diameter of 65 µm or less at its upper end. This is because the slit aperture diameter s is enlarged and because the shot number is increased considering that the upper insulating resin layer 6 contains much inorganic filler f. A fourth shot may also be made in case the shape or the internal diameter of the via hole 10 is still small even with the third laser shot.

Next, the surface of the upper insulating resin layer 6 including the inside of the via hole 10 is subjected to a swelling treatment at 60 to 80° C. for 5 to 10 minutes. As a result, a surface layer portion, into which the aforementioned solution has penetrated to give a weak swelled state, is formed in the surface of the upper insulating resin layer 6 (7) and the inner wall face of the via hole 10 (11).

Next, the core substrate 1 or the panel having been subjected to the aforementioned swelling treatment is rinsed with water, and the surface layer portions of the upper insulating resin layers 6 and 7 having the via hole 10 (11) formed therein are subjected a roughening treatment, in which they are dipped in $NaMnO_4 \cdot 3H_2O$ or $KMnO_4$ under conditions of about 30° C.×about 20 to 30 minutes.

Figure 10:
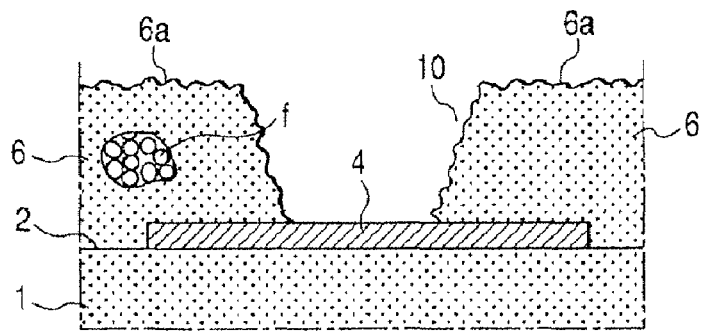
FIG. 10 is a schematic section showing a manufacturing process subsequent to FIG. 9.

As a result, a rough face 6*a* (7*a*) having a roughened surface layer portion and a number of asperities is formed on the surface of the upper insulating resin layer 6 (7) and on the inner wall face of the via hole 10 (11), as shown in FIG. 10. The roughened face 6*a* (7*a*) has a roughness of Ra of 0.2 µm or more and 1.0 µm or less and Rz of 0.2 µm or more and 1.0 µm or less. In parallel with this, the inner wall face of the aforementioned through hole 8 is likewise roughened.

Moreover, a plating catalyst containing Pd is applied to the roughened inner wall faces of the via holes 10 and 11, the roughened faces 6*a* (7*a*) of the upper insulating resin layers 6 and 7, and the inner wall face of the through hole 8. After this, those faces are electrolessly and electrolytically plated with copper.

Figure 11:
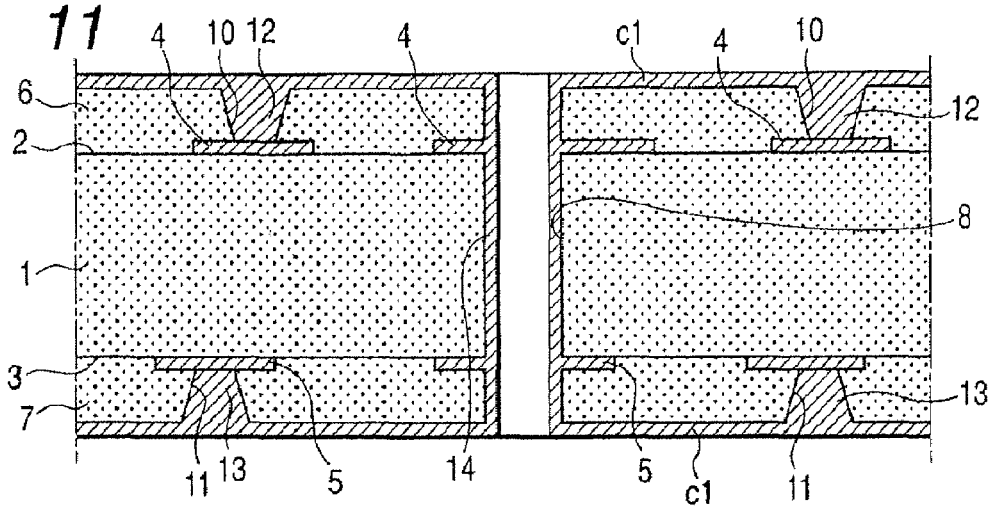
FIG. 11 is a schematic section showing a manufacturing process subsequent to FIG. 10.

As a result, copper-plated films c1 are individually formed all over the surfaces of the upper insulating resin layers 6 and 7, and a generally cylindrical through-hole conductor 14 having a thickness of about 40 µm is formed in the through hole 8, as shown in FIG. 11. At the same time, the via holes 10 and 11 are additionally plated therein with copper to form filled via conductors 12 and 13.

Figure 12:
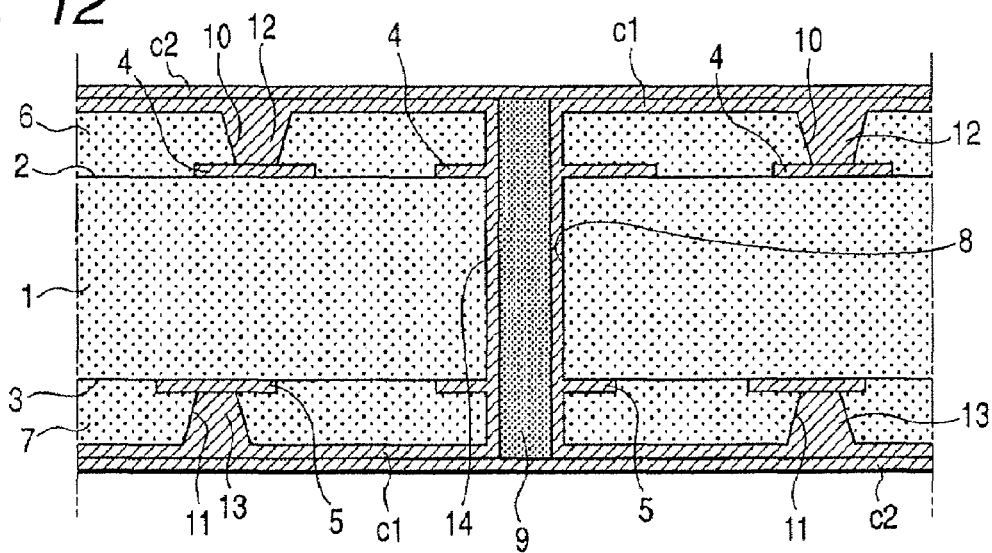
FIG. 12 is a schematic section showing a manufacturing process subsequent to FIG. 11.

Next, the through-hole conductor 14 is filled on its inner side with a filler resin 9 containing an inorganic filler like before, as shown in FIG. 12. Here, the filler resin 9 may be either a conductive resin containing metal powder or an inconductive resin.

As shown in FIG. 12, moreover, the upper faces of the copper-plated films c1 and c2 and the two end faces of the filler resin 9 are electrically plated with copper to form copper-plated films c2 and c2. Simultaneously with this, the filler resin 9 is cover-plated on its two end faces. Here, the copper-plated films c1 and c2 have an entire thickness of about 15 µm.

Figure 13:
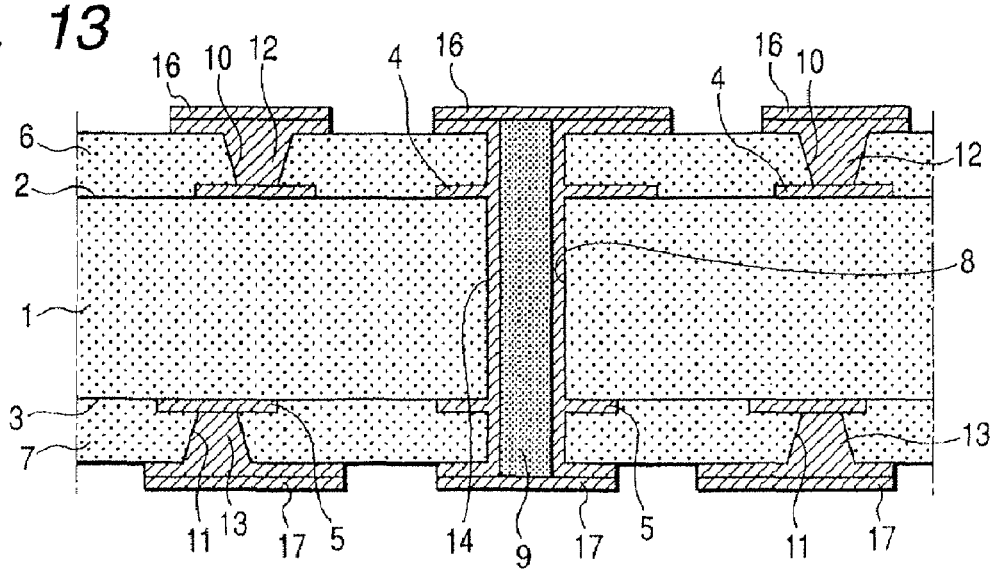
FIG. 13 is a schematic section showing a manufacturing process subsequent to FIG. 12.

Next, the not-shown photosensitive/insulating dry film is formed over the copper-plated films c1 and c2, and is subjected to an exposure and a development of a predetermined pattern. After this, the etching resist obtained and the copper-plated films c1 and c2 lying just below the former are removed with a peeling liquid. As a result, wiring pattern layers 16 and 17 profiling the aforementioned pattern are formed on the surfaces of the upper insulating resin layers 6 and 7, as shown in FIG. 13.

The wiring pattern layers 16 and 17 and the via conductors 12 and 13 can acquire a strong adhesion to the upper insulating resin layers 6 and 7, no matter whether the wiring pattern layers 16 and 17 might be narrowed at a fine pitch or the via conductors 12 and 13 might be diametrically reduced, because the surfaces of the upper insulating resin layers 6 and 7 adjoining the layers 16 and 17 and the conductors 12 and 13 are roughened (at 6*b* and 7*b*).

Figure 14:
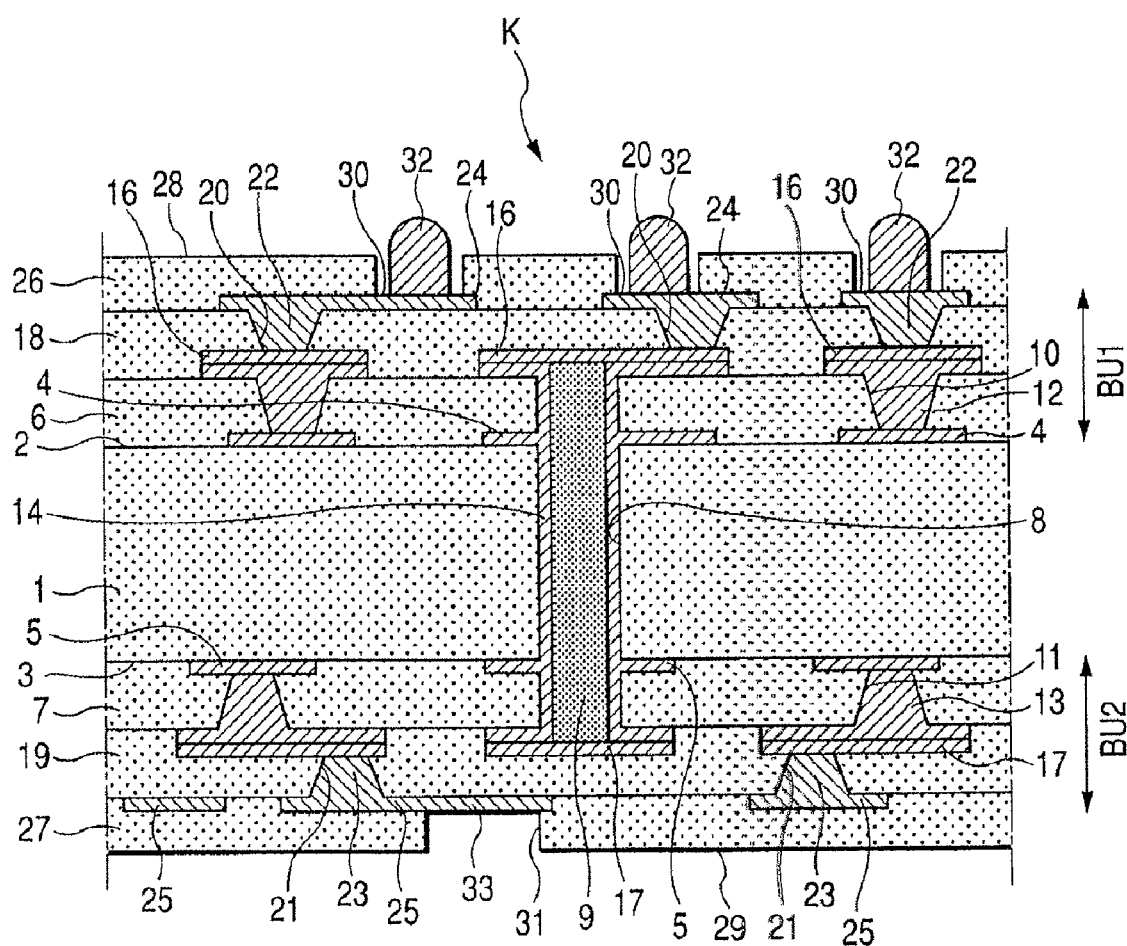
FIG. 14 is a schematic section showing the manufacturing steps subsequent to FIG. 13 and a wiring substrate obtained.

As shown in FIG. 14, the surfaces of the upper insulating resin layer 6 and the wiring pattern layer 16, and the surfaces of the upper insulating resin layer 7 and the wiring pattern layer 17 are individually covered with insulating films having a thickness like before, to form new upper insulating resin layers 18 and 19. Here, the aforementioned insulating resin layers 6 and 7 become lower insulating resin layers with respect to the upper insulating resin layers 18 and 19.

Next, the surfaces of the upper insulating resin layers 18 and 19 are irradiated at their predetermined positions and along their thickness direction with a carbon-dioxide gas laser under the conditions like before, thereby to form generally conical and diametrically small via holes 20 and 21, which extend through the upper insulating resin layers 18 and 19 so that the wiring pattern layers 16 and 17 are exposed to the bottom faces of the via holes 20 and 21, as shown in FIG. 14.

The entire surfaces of the insulating resin layers 18 and 19 including the inner wall faces of the via holes 20 and 21 are subjected to a roughening step including the swelling treatment and the roughening treatment like before, thereby to form roughened faces having a number of asperities like before.

Next, a plating catalyst like before is applied in advance to the entire surfaces of the roughened upper insulating resin layers 18 and 19 including the aforementioned via holes 20 and 21. After this, the entire surfaces are electrolessly plated with copper to form a (not-shown) thin copper film layer having a thickness of about 0.5 µm.

Next, the entire surface of the thin copper film layer is covered with a (not-shown) photosensitive/insulating film composed of an epoxy resin having a thickness of about 25 µm. This insulating film is exposed to an exposure and a development, and the exposed portion or the unexposed portion is removed with a peeling liquid.

As a result, the not-shown plated resist profiling the aforementioned pattern is formed on the surface of the thin copper film layer. At the same time, a wide clearance is formed in the surface of the adjoining thin copper film layers over the via holes 20 and 21.

Next, the thin copper film layer positioned on the bottom face of the clearance and in the via holes 20 and 21 is electrically plated with copper. As a result, filled via conductors 22 and 23 are individually formed in the via holes 20 and 21, and wiring pattern layers 24 and 25 (or built-up wiring layers) to be connected with the via conductors 22 and 23 are formed in the aforementioned clearances. After this, the aforementioned plated resist and the thin copper film layer just below are removed.

The wiring pattern layers 24 and 25 and the filled via conductors 22 and 23 can also acquire a strong adhesion to the upper insulating resin layers 18 and 19, no matter whether the wiring pattern layers 24 and 25 might be narrowed at a fine pitch or the via conductors 22 and 23 might be diametrically reduced, because the surfaces of the upper insulating resin layers 18 and 19 adjoining the layers 24 and 25 and the conductors 22 and 23 are roughened.

As shown in FIG. 14, moreover, a solder resist layer (or an insulating layer) 26 made of a resin like before and having a thickness of about 25 μm is formed over the surface of the upper insulating resin layer 18 having the wiring pattern layers 24 formed thereon. A solder resist layer (or an insulating layer) 27 like before is formed over the surface of the upper insulating resin layer 19 having the aforementioned wiring pattern layers formed thereon.

The solder resist layers 26 and 27 are bored so deep at predetermined positions with a laser as to reach the wiring pattern layers 24 and 25, thereby to form a land to be opened to a first principal face 28 and an opening 39 to be opened to a second principal face 33$a$, as shown in FIG. 14.

A solder bump 32 protruding higher than the first principal face 28 is formed on the land 30, so that electronic parts such as the not-shown IC chip can be mounted over the solder bump 38 through solder. Here, the solder bump 32 is made of an alloy of a low melting point such as Sn—Cu, Sn—Ag or Sn—Zn.

As shown in FIG. 14, moreover, the surface of a wiring line 33, which extends from the wiring pattern layer 25 and which is positioned on the bottom face of an opening 31, is plated, although not shown, with Ni or Au to provide connection terminals to be connected with a printed substrate such as the not-shown mother board.

Through the individual steps thus far described, it is possible to provide a wiring substrate K, which comprises the built-up layer BU1 and the built-up layer BU1 over the surface 2 and the back 3 of the core substrate 1, as shown in FIG. 14. The built-up layer BU1 includes the wiring pattern layers 16 and 24 at the fine pitch and the diametrically reduced via conductors 12 and 22, and the built-up layer BU2 includes the wiring pattern layers 17 and 25, and the diametrically reduced via conductors 13 and 23.

Here, the wiring substrate K may also be formed to have the built-up layer BU1 exclusively over the surface 2 of the core substrate 1. In this mode, only the wiring pattern layer 17 and the solder resist layer 27 are formed on the side of the back 3 of the core substrate 1.

According to the process for manufacturing the wiring substrate K of the invention thus far described, the upper insulating resin layers 6, 18, 7 and 19 containing the large quantity of inorganic filler f are irradiated with the carbon-dioxide gas laser L under the aforementioned conditions. As a result, the via holes 10, 11, 20 and 21 having their lower end openings and the upper end openings diametrically reduced can be formed to form the filled via conductors 12, 13, 22 and 23 having similar shapes reliably. Even if the wiring pattern layers 16, 17, 24 and 25 are wired at a narrowed fine pitch, therefore, they can be reliably connected to have conductions inbetween while keeping their electric characteristics. This can contribute to the size reduction of the wiring substrate and the fine pitch of the wiring pattern layers.

The invention should not be limited to the mode of embodiment thus far described.

The individual steps of the aforementioned manufacturing process may also be performed by a large-sized multi-panel having a plurality of core substrates 1 or core units.

Moreover, the material for the core substrate to become the lower insulating resin layers should not be limited to the aforementioned ST resin but may be exemplified by an epoxy resin or a polyimide resin. Alternatively, it is also possible to use a composite material which is prepared by containing glass fibers in a fluorine resin having a three-dimensional net structure such as PTFE having continuous pores.

Alternatively, the material of the aforementioned core substrate may be ceramics. This ceramics may be alumina, silicic acid, glass ceramics or aluminum nitride, and may also be exemplified by a low-temperature sintered substrate which can be sintered at a relatively low temperature such as about 1,000° C. Moreover, a metal core substrate made of a copper alloy or a Ni alloy containing 42 wt. % of Fe may be used and is covered all over its surface with an insulating material.

Moreover, the mode may also be modified into a coreless substrate having no core substrate. In this modification, for example, the aforementioned upper insulating resin layers 6 and 7 act as the insulating substrate.

Moreover, the material for the aforementioned wiring layers 4 and 5 or the like may be not only the aforementioned Cu (copper) but also Ag, Ni or Ni—Au. Alternatively, the wiring layer 10 does not use the metal-plated layer but may also be formed by a method of applying a conductive resin.

Moreover, the aforementioned upper insulating resin layers 6 and 7 and so on may also be exemplified, if it contains the aforementioned inorganic filler, not only by the aforementioned resin composed mainly of an epoxy resin or but also by a polyimide resin, a BT resin or a PPE resin, which has similar heat resistance and pattern forming properties, or a resin-resin composite material which is prepared by impregnating a fluorine resin having a three-dimensional net structure such as PTFE having continuous pores with a resin such as an epoxy resin.

Moreover, the via conductors need not be the aforementioned filled via conductor 12 but can be an inverted conical conformable via conductor which is not filled therein completely with a conductor. Alternatively, the via conductors may take a staggered shape, in which they are stacked while being axially shifted, or a shape, in which a wiring layer extending midway in the planar direction is interposed.

This application is based on Japanese Patent application JP 2003-398493, filed Nov. 18, 2003, the entire content of which is hereby incorporated by reference, the same as if set forth at length.

What is claimed is:

1. A wiring substrate comprising:
   a lower insulating resin layer;
   wiring pattern layers provided on surfaces of the lower insulating resin layer;
   upper insulating resin layers provided on surfaces of the lower insulating resin layer and the wiring pattern layers;

via holes extending through at least one of the upper insulating resin layers; and via conductors provided in the via holes and connected electrically with at least one of the wiring pattern layers, wherein at least one of the upper insulating resin layers contains an epoxy resin containing 30 to 50% by weight of an inorganic filler of $SiO_2$ having an average grain diameter of 1.0 to 10.0 μm and a thermal coefficient of greater than 40 ppm/° C. to 50 ppm/° C., and at least one of the via holes has a lower end opening diameter of 40 μm or more and less than 60 μm on a side of the wiring pattern layers.

2. The wiring substrate according to claim 1, wherein each of the upper insulating resin layers contains an epoxy resin containing 30 to 50% by weigh of an inorganic filler of $SiO_2$ having an average grain diameter of 1.0 to 10.0 μm.

3. The wiring substrate according to claim 1, wherein each of the via holes has a lower end opening diameter of 40 μm or more and less than 60 μm on a side of the wiring pattern layers.

4. The wiring substrate according to claim 1, wherein at least one of the upper insulating resin layers contains 50 to 70% by weight of the epoxy resin.

5. A process for manufacturing a wiring substrate, comprising:

a step of forming wiring pattern layers on surfaces of a lower insulating resin layer;

a step of forming upper insulating resin layers on surfaces of the lower insulating resin layer and the wiring pattern layers; and a step of forming via holes in at least one of the upper insulating resin layers by a laser machining, wherein at least one of the upper insulating resin layers contains an epoxy resin containing 30 to 50% by weight of an inorganic filler of $SiO_2$ having an average grain diameter of 1.0 to 10.0 μm and a thermal coefficient of greater than 40 ppm/° C. to 50 ppm/° C., at least one of the via holes has a lower end opening diameter of 40 μm or more and less than 60 μm on a side of the wiring pattern layers, and the via holes are formed by a plurality of shots of the laser machining.

6. The process according to claim 5, wherein each of the upper insulating resin layers contains an epoxy resin containing 30 to 50% by weigh of an inorganic filler of $SiO_2$ having an average grain diameter of 1.0 to 10.0 μm.

7. The process according to claim 5, wherein each of the via holes has a lower end opening diameter of 40 μm or more and less than 60 μm on a side of the wiring pattern layers.

8. The process according to claim 5, wherein at least one of the upper insulating resin layers contains 50 to 70% by weight of the epoxy resin.

9. The process according to claim 5, further comprising, after the step of forming via holes, a step of roughening inner wall faces of the via holes, so that roughened inner wall faces have a center line average roughness of 0.2 to 1.0 μm.

* * * * *